(12) United States Patent
He (10) Patent No.: US 10,741,617 B2
(45) Date of Patent: Aug. 11, 2020

(54) PIXEL STRUCTURE, ARRAY SUBSTRATE AND DISPLAY DEVICE

(71) Applicant: HKC CORPORATION LIMITED, Shenzhen, Guangdong (CN)

(72) Inventor: Huailiang He, Guangdong (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 16/313,511

(22) PCT Filed: Nov. 8, 2018

(86) PCT No.: PCT/CN2018/114496
§ 371 (c)(1),
(2) Date: Dec. 27, 2018

(87) PCT Pub. No.: WO2020/073401
PCT Pub. Date: Apr. 16, 2020

(65) Prior Publication Data
US 2020/0111849 A1    Apr. 9, 2020

(30) Foreign Application Priority Data

Oct. 9, 2018 (CN) .......................... 2018 1 1180804

(51) Int. Cl.
*H01L 27/32* (2006.01)
*G02F 1/1362* (2006.01)
(Continued)

(52) U.S. Cl.
CPC .... *H01L 27/3218* (2013.01); *G02F 1/133514* (2013.01); *G02F 1/136286* (2013.01); *H01L 27/322* (2013.01); *H01L 27/3213* (2013.01); *H01L 27/3216* (2013.01); *H01L 27/3276* (2013.01); *G02F 2201/52* (2013.01); *G09G 3/2003* (2013.01); *G09G 3/3607* (2013.01); *G09G 2300/0452* (2013.01); *H01L 2251/5315* (2013.01)

(58) Field of Classification Search
None
See application file for complete search history.

(56) References Cited

U.S. PATENT DOCUMENTS 9,798,182 B2    10/2017    Im et al.
9,846,340 B1 *  12/2017    Lin ..................... G02F 1/13394
(Continued)

FOREIGN PATENT DOCUMENTS

CN    202512325 U    10/2012
CN    102830559 A    12/2012
(Continued)

OTHER PUBLICATIONS

Jing Yang, the ISA written comments. Jun. 2019, CN.
Jing Yang, the International Search Report, Jun. 2019, CN.

*Primary Examiner* — Dung A. Le (57) ABSTRACT

A pixel structure includes a plurality of pixel units including three-primary-color sub-pixel groups and a plurality of fourth sub-pixels which are alternatively arranged. The fourth sub-pixel has a color different from that of the three-primary-color sub-pixel groups. The fourth sub-pixel is arranged between two adjacent three-primary-color sub-pixel groups.

20 Claims, 6 Drawing Sheets

(51) Int. Cl.
    *G02F 1/1335*    (2006.01)
    *G09G 3/20*      (2006.01)
    *G09G 3/36*      (2006.01)

(56) References Cited

U.S. PATENT DOCUMENTS

| | | | |
|---|---|---|---|
| 2013/0222216 A1* | 8/2013 | Park | G09G 3/3614 |
| | | | 345/55 |
| 2017/0186408 A1* | 6/2017 | Nagayama | G09G 3/2003 |
| 2017/0270847 A1* | 9/2017 | Jin | G09G 3/2003 |
| 2018/0114483 A1* | 4/2018 | Kim | G09G 3/2003 |
| 2019/0056609 A1* | 2/2019 | Kim | G02F 1/1368 |

FOREIGN PATENT DOCUMENTS

| | | |
|---|---|---|
| CN | 103744207 A | 4/2014 |
| CN | 104155823 A | 11/2014 |
| CN | 104238221 A | 12/2014 |
| CN | 106556953 A | 4/2017 |
| CN | 107121853 A | 9/2017 |
| CN | 107942593 A | 4/2018 |

\* cited by examiner

PIXEL STRUCTURE, ARRAY SUBSTRATE AND DISPLAY DEVICE

CROSS-REFERENCES TO RELATED APPLICATION

This application is the International Application No. PCT/CN2018/114496 for entry into US national phase with an international filing date of Nov. 8, 2018 designating US, now pending, and claims priority to Chinese Patent Application 201811180804.9, filed on Oct. 9, 2018, the content of which is incorporated herein by reference in its entirety.

BACKGROUND

Field of the Invention

The present disclosure relates to the field of display technologies, and in particular, to pixel structure, array substrate and display device.

Description of Related Art

Liquid crystal display (LCD) is a commonly used electronic device that is widely favored by users due to its low power consumption, small size, and light weight. Currently the liquid crystal display is mainly a thin film transistor liquid crystal display (TFT-LCD).

In a TFT-LCD, a plurality of pixel units are arranged in a matrix form, each pixel unit includes three sub-pixels of red (R), green (G) and blue (B), and each sub-pixel includes a filter of a corresponding color. The color displayed on the screen, that is, the light from the backlight, is a mixture of the three-primary-colors R, G, and B. This is RGB technology. When the light from the backlight passes through the filter of one color, the light of the corresponding color can pass and the light of other colors cannot pass. Different sub-pixels of the plurality of pixel units are turned on or turned off, such that the image with different colors can be displayed.

On the basis of RGB technology, WRGB technology has also appeared, that is, for each pixel unit a white sub-pixel (W) is added. The W sub-pixel does not cause backlight loss, so the pixel unit of WRGB technology has higher penetration rate, and the W sub-pixels can also extend the color gamut. The area of each of the R, G, B, and W sub-pixels is ¼ of the area of all sub-pixels, and the area used for solid color image display is ¼ of the area of all sub-pixels. As the W sub-pixels are added, the area of each of the R, G, and B sub-pixels is reduced by 1/12 (in the case of the same resolution) and the brightness of the displayed solid color image is lowered. Although the R, G, and B sub-pixels can be processed by the adjustment of gamma-voltage to increase the brightness when the respective solid color image is displayed, the process is too complicated and difficult to develop.

SUMMARY

An object of some implementations of the present disclosure is to provide a pixel structure, solving the technical problem including, but not limited to, the low luminance when displaying a solid color image in WRGB technology.

To solve the above technical problem, according to an embodiment of the present disclosure, it is provided a pixel structure comprising a plurality of pixel units arranged in an array form, a plurality of scan lines, and a plurality of data lines.

The pixel unit includes a plurality of three-primary-color sub-pixel groups and a plurality of fourth sub-pixels. The three-primary-color sub-pixel group includes a first sub-pixel, a second sub-pixel and a third sub-pixel. At least one of the fourth sub-pixels is arranged between respective adjacent two of the three-primary-color sub-pixel groups, and the fourth sub-pixel has a color different from any of the first sub-pixel, the second sub-pixel and the third sub-pixel.

In an embodiment, the plurality of fourth sub-pixels and the plurality of three-primary-color sub-pixel groups are alternately arranged in a row direction; or the plurality of fourth sub-pixels and the plurality of three-primary-color sub-pixel groups are alternately arranged in a column direction.

In an embodiment, the fourth sub-pixel is selected from a group consisting of white sub-pixel, yellow sub-pixel and cyan sub-pixel, and the first sub-pixel, the second sub-pixel and the third sub-pixel are selected from a group consisting of red sub-pixel, green sub-pixel, and blue sub-pixel.

In an embodiment, the first sub-pixel, the second sub-pixel, and the third sub-pixel are the same in area.

In an embodiment, the areas of the first sub-pixel, the second sub-pixel, and the third sub-pixel are not completely equal.

In an embodiment, the first sub-pixel, the second sub-pixel, the third sub-pixel, and the fourth sub-pixel are the same in area.

In an embodiment, the first sub-pixel, the second sub-pixel, the third sub-pixel, and the fourth sub-pixel are arranged in a column direction and connected to a same one of the data lines, and each of the first sub-pixel, the second sub-pixel, the third sub-pixel and the fourth sub-pixel is connected to a respective one of the scan lines.

In an embodiment, the first sub-pixel, each of the second sub-pixel, the third sub-pixel and the fourth sub-pixel is located at a same side of the respective one of the scan lines.

In an embodiment, the first sub-pixel, the second sub-pixel, the third sub-pixel, and the fourth sub-pixel are arranged in a row direction and connected to a same one of the scan lines, and each of the first sub-pixel, the second sub-pixel, the third sub-pixel and the fourth sub-pixel is connected to a respective one of the data lines.

In an embodiment, each of the first sub-pixel, the second sub-pixel, the third sub-pixel and the fourth sub-pixel is located at a same side of the respective one of the data lines.

In an embodiment, the fourth sub-pixels and the three-primary-color sub-pixel groups are alternately arranged in a row direction, and the first sub-pixel, the second sub-pixel and the third sub-pixel of one said three-primary-color sub-pixel group are sequentially arranged in a column direction.

In an embodiment, the first sub-pixel, the second sub-pixel and the third sub-pixel are connected to a same one of the data lines, the fourth sub-pixel is connected to an adjacent one of the data lines, each of the first sub-pixel, the second sub-pixel and the third sub-pixel is connected to a corresponding scan line, and the fourth sub-pixel is connected to any one of three said corresponding scan lines.

In an embodiment, the fourth sub-pixels and the three-primary-color sub-pixel groups are alternately arranged in a column direction, and the first sub-pixel, the second sub-pixel and the third sub-pixel of one said three-primary-color sub-pixel group are sequentially arranged in a row direction.

In an embodiment, the first sub-pixel, the second sub-pixel and the third sub-pixel are connected to a same one of the scan lines, the fourth sub-pixel is connected to an adjacent one scan line, each of the first sub-pixel, the second sub-pixel and the third sub-pixel is connected to a corresponding data line, and the fourth sub-pixel is connected to any one of the three said corresponding data lines.

In an embodiment, the first sub-pixel, the second sub-pixel and the third sub-pixel of the three-primary-color sub-pixel group are arranged in two rows or two columns.

In an embodiment, the pixel unit comprises four said three-primary-color sub-pixel groups and three white sub-pixels spaced between the four said three-primary-color sub-pixel groups.

According to another embodiment of the present disclosure, it is provided an array substrate, comprising a base layer which has a display area and a non-display area around the display area, wherein a pixel structure is arranged in the display area, the pixel structure comprises a plurality of pixel units arranged in an array form, a plurality of scan lines and a plurality of data lines;

wherein the pixel unit includes:
four three-primary-color sub-pixel groups, wherein the three-primary-color sub-pixel group includes a first sub-pixel, a second sub-pixel and a third sub-pixel; and
three fourth sub-pixels, wherein each of the four sub-pixels is arranged between respective two adjacent three-primary-color sub-pixel groups, the fourth sub-pixel has a color different from any of the first sub-pixel, the second sub-pixel and the third sub-pixel, and the first sub-pixel, the second sub-pixel, the third sub-pixel and the fourth sub-pixel are the same in area.

According to yet another embodiment of the present disclosure, it is provided a display device, comprising an array substrate, wherein the array substrate comprises a base layer, the base layer has a display area and a non-display area around the display area, a pixel structure is arranged in the display area, and the pixel structure comprises a plurality of pixel units arranged in an array form, a plurality of scan lines and a plurality of data lines;

wherein the pixel unit includes:
a plurality of three-primary-color sub-pixel groups, wherein the three-primary-color sub-pixel group includes a first sub-pixel, a second sub-pixel and a third sub-pixel; and
a plurality of fourth sub-pixels, wherein at least one of the fourth sub-pixels is arranged between respective adjacent two of the plurality of three-primary-color sub-pixel groups, and the fourth sub-pixel has a color different from any of the first sub-pixel, the second sub-pixel and the third sub-pixel.

In an embodiment, the display device is a liquid crystal display device or an organic light emitting diode display device.

In some embodiments of the present disclosure, a pixel structure includes a plurality of pixel units arranged in an array, each pixel unit includes a plurality of three-primary-color sub-pixel groups and a plurality of fourth sub-pixels, and the three-primary-color sub-pixel group include a first sub-pixel, a second sub-pixel and a third sub-pixel. The fourth sub-pixel is arranged between adjacent two of the three-primary-color sub-pixel groups, that is, the adjacent two three-primary-color sub-pixel groups share a fourth sub-pixel. The fourth sub-pixel has a color different from any of the first sub-pixel, the second sub-pixel and the third sub-pixel. Compared with the pixel structure in which each pixel unit includes four sub-pixels, in some embodiments of the present disclosure, in the case of the same display area, the area of a part of the fourth sub-pixel is saved, so that the area of the three primary color sub-pixel groups is increased. When a solid color image needs to be displayed, a larger area can be provided for the corresponding solid color light to pass, thereby improving the transmittance of the solid color light and improving the brightness of the solid color image when displayed. Further, it is ensured that each pixel unit includes at least two fourth sub-pixels, thus high transmittance, high brightness and wide color gamut of other image when displayed can be ensured without requiring complicated adjustment of gamma voltage, the manufacture is simple and display quality can be improved. Besides, the array substrate and the display device can provide a larger area for the corresponding solid color light to pass, thereby improving the transmittance of the solid color light and improving the brightness of the solid color image when displayed. Further, high transmittance, high brightness and wide color gamut of other image when displayed can be ensured without requiring complicated adjustment of gamma voltage, the manufacture is simple and display quality can be improved.

BRIEF DESCRIPTION OF THE DRAWINGS

In order to more clearly illustrate the technical solutions in the embodiments of the present disclosure, the drawings used in the embodiments or the prior art description will be briefly described below. It is obvious that the drawings in the following description are only some embodiments of the present disclosure. To those skilled in the art, other drawings may be obtained from these drawings without paying any creative effort.

DESCRIPTION OF THE EMBODIMENTS

In order to make the technical problems to be solved by the present disclosure, technical solutions and beneficial effects more clear, the present disclosure will be further described in detail below with reference to the accompanying drawings and embodiments. It should be understood that the specific embodiments described herein are merely illustrative of the present disclosure and are not intended to limit the present disclosure.

It should be noted that when an element is referred to as being "fixed" or "arranged" on another element, it may be directly or indirectly on another element. When an element is referred to as being "connected" to another element, it may be directly or indirectly connected to another element. It should be understood that the orientation or position relationship indicated by the terms "upper", "lower", "left", "right" or the like is based on the orientation or position relationship shown in the drawings, and is merely for convenience of description, instead of indicating or implying that the device or the component referred to must have a particular orientation or be constructed and operated in a particular orientation, and therefore should not be construed to limit the present disclosure. To those skilled in the art, the specific meanings of the above terms should be understood on a case-by-case basis. Moreover, the terms "first" and "second" are used for descriptive purposes only and should not be construed as indicating or implying relative importance or implicitly indicating the number of the technical features indicated. The term "a plurality of" means two or more, unless otherwise specifically defined.

In order to explain the technical solutions described in the present disclosure, the following detailed description will be made with reference to the specific drawings and embodiments.

Figure 1:
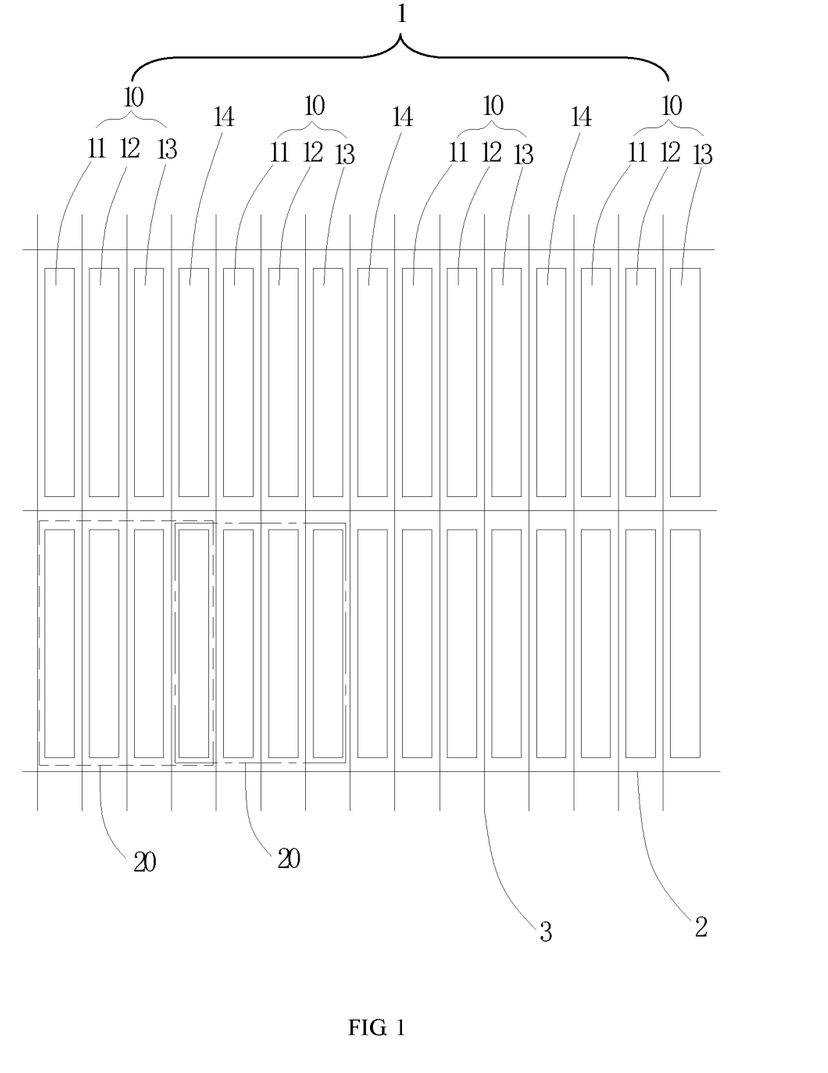
FIG. 1 is a schematic diagram of a pixel structure according to a first embodiment of the present disclosure.

Referring to FIG. 1, a pixel structure (may also be referred to as pixel arrangement) according to a first embodiment of the present disclosure includes a plurality of pixel units 1 arranged in an array form, a plurality of scan lines 2 extending in the row direction and spaced apart in the column direction and a plurality of data lines 3 extending in the column direction and spaced apart in the row direction. Each pixel unit 1 includes a plurality of three-primary-color sub-pixel groups 10 and a plurality of fourth sub-pixels 14. The three-primary-color sub-pixel groups 10 and the fourth sub-pixels 14 are alternately arranged in the row direction, and each fourth sub-pixel 14 is arranged between two adjacent three-primary-color sub-pixel groups 10.

The three-primary-color sub-pixel group 10 includes a first sub-pixel 11, a second sub-pixel 12, and a third sub-pixel 13. The first sub-pixel 11, the second sub-pixel 12, and the third sub-pixel 13 are selected from a group consisting of red sub-pixel, green sub-pixel and blue sub-pixel. The first sub-pixel 11, the second sub-pixel 12, and the third sub-pixel 13 are different from each other in color, and the fourth sub-pixel 14 is different from the first sub-pixel 11, the second sub-pixel 12 and the third sub-pixels 13 in color. The fourth sub-pixels 14 are selected from a group consisting of white sub-pixel, yellow sub-pixel and cyan sub-pixel, other than red sub-pixel, green sub-pixel and blue sub-pixel. White sub-pixel or yellow sub-pixel has the light transmittance great than red sub-pixel, green sub-pixel, and blue sub-pixel, thus the light transmittance can be improved, thereby improving the brightness of the image to be displayed. Cyan sub-pixel or yellow sub-pixel can extend the color gamut of the image to be displayed, making the image to be displayed more colorful.

Each fourth sub-pixel 14 is arranged between respective two adjacent three-primary-color sub-pixel groups 10, that is, for each pixel unit 1, the number of the fourth sub-pixels 14 is one less than the number of the three-primary-color sub-pixel groups 10. Compared with the WRGB technology in which each pixel unit 1 is composed of four sub-pixels, in the embodiment of the present disclosure, the area for the saved one fourth sub-pixel 14 is provided for the plurality of three-primary-color sub-pixel groups 10, thereby decreasing the filter area for filtering the three-primary-colors of the sub-pixel group 10, thereby improving the brightness of the solid color image when displayed. Further, as the plurality of, that is, at least two, fourth sub-pixels 14 are arranged in the pixel unit 1 of the present disclosure, higher brightness and/or wide color gamut of the image to be displayed can be assured.

A fourth sub-pixel 14 is arranged between two adjacent three-primary-color sub-pixel groups, so the fourth sub-pixel 14 is shared by the two adjacent three-primary-color sub-pixel groups 10. Assuming that a three-primary-color sub-pixel group 10 and a fourth sub-pixel 14 are regarded as a four-color sub-pixel group 20, when two adjacent four-color sub-pixel groups 20 are used for displaying an image if the color of the fourth sub-pixel 14 is required, the fourth sub-pixel 14 is turned on to be used by one or both of the two adjacent three-primary-color sub-pixel groups 10, while if the color of the fourth sub-pixel 14 is not required, the fourth sub-pixel 14 between the two adjacent three-primary-color sub-pixel groups 10 is turned off, thereby achieving the share of the fourth sub-pixel 14.

In an implementation, the share of the fourth sub-pixels 14 can be achieved by a comparator. Each of the two input terminals of the comparator is connected to a corresponding one of the two data signals from the source driver, the output terminal of the comparator is connected to the data line 3 connected to the fourth sub-pixel 14, and the output terminal of the comparator always outputs the larger of the two input data signals, such that when the image displayed by two adjacent four-color sub-pixel groups 20 requires the color of at least one fourth sub-pixel 14, the fourth sub-pixel 14 is turned on.

As shown in FIG. 1, the first sub-pixel 11, the second sub-pixel 12, and the third sub-pixel 13 in the three-primary-color sub-pixel group 10 are sequentially arranged in the row direction. In a pixel unit 1, the first sub-pixel 11, the second sub-pixel 12, the third sub-pixel 13 and the fourth sub-pixel 14 are connected to a same scan line 2, and each of the first sub-pixel 11, the second sub-pixel 12, the third sub-pixel 13 and the fourth sub-pixel 14 is connected to a corresponding data line 3.

Each of the first sub-pixel 11, the second sub-pixel 12, the third sub-pixel 13 and the fourth sub-pixel 14 is located at the same side of the corresponding data line 3, which has the advantage that even within the same display area, when it is required to reduce the distance between two adjacent data lines 3 due to the increase of the number of the data lines 3, because the two adjacent data lines 3 are separated by the first sub-pixel 11, the second sub-pixel 12, the third sub-pixel 13 or the fourth sub-pixel 14, the capacitive effect between the two adjacent data lines 3, which may cause an excessive load or affect the manufacture of the data lines 3, will not generate, thereby ensuring the display effect.

Optionally, the first sub-pixel 11, the second sub-pixel 12, the third sub-pixel 13, and the fourth sub-pixel 14 may be the same in area. Each of the first sub-pixel 11, the second sub-pixel 12, the third sub-pixel 13 and the fourth sub-pixel 14 has a rectangular shape with the length extending in the column direction. The areas of the first sub-pixel 11, the second sub-pixel 12 and the third sub-pixel 13 are not completely equal. For example, the area of red sub-pixel may be increased to reduce the color temperature or the area of blue sub-pixel may be increased to increase the color temperature, such that the color temperature requirements of various different display panels can be adapted.

In the pixel unit 1 according to the present disclosure, since each fourth sub-pixel 14 is arranged between two adjacent three-primary-color sub-pixel groups 10, the number of the fourth sub-pixels 14 is one less than the number of the three-primary-color sub-pixel groups 10. In one pixel unit, the smaller the number of the fourth sub-pixels 14 is, the more the area of three-primary-color sub-pixel groups 10 is increased, the more obvious the brightness of the solid color image when displayed is improved and the larger the area of fourth sub-pixels 14 is decreased, which has greater influence on the overall brightness and the color gamut of the image to be displayed.

Specifically, as shown in FIG. 1, in the pixel unit 1, the number of the fourth sub-pixels 14 is three, and the number of the three-primary-color sub-pixel groups 10 is four. When the first sub-pixel 11, the second sub-pixel 12, the third sub-pixel 13 and the fourth sub-pixel 14 are the same in area, the area of each of the first sub-pixel 11, the second sub-pixel 12, the third sub-pixel 13 and the four sub-pixel 14 is $1/15$ of the area of all sub-pixels of the pixel unit 1, and the area of the sub-pixels (4 red sub-pixels, 4 green sub-pixels or 4 blue sub-pixels) for displaying the solid color image is $4/15$. The area of the sub-pixels for displaying each solid color image is increased by $1/60$, and the area of the fourth sub-pixels 14 is reduced by $1/20$.

It should be understood that when any other image in which the fourth sub-pixel 14 is not turned on, that is, the image in which at least two of the red sub-pixel, the green sub-pixel and the blue sub-pixel are turned on, is displayed, the brightness is also improved. In the present disclosure, the luminance in the case where only the fourth sub-pixels 14 are turned on is reduced by $3/60$, however the probability that only the fourth sub-pixels 14 are turned on is extremely low, therefore, from the perspective of the entire displayed image, the present application can significantly improve the brightness of each solid color picture, and has less influence on the brightness and color gamut of the entire display screen.

In a comparative example, in each pixel unit 1, the number of the fourth sub-pixel 14 is 1, and the number of the three-primary-color sub-pixel groups 10 is two, that is, a fourth sub-pixel 14 is shared by the two three-primary-color sub-pixel groups 10. The area of each of the first sub-pixel 11, the second sub-pixel 12, the third sub-pixel 13 and the fourth sub-pixel 14 is $1/7$ of the area of all sub-pixels of the pixel unit 1, and the area of the sub-pixels (2 red sub-pixel, 2 green sub-pixels or 2 blue sub-pixels) for displaying the solid color image is $2/7$. The area of the sub-pixels for displaying each solid color image is increased by $1/28$, and the area of the fourth sub-pixel 14 is reduced by $3/28$. Compared with the first embodiment, in this example, the influence on the brightness of the entire displayed image is relatively large.

Alternatively, the number of the fourth sub-pixels 14 in the pixel unit 1 may be 2 or 4, which can significantly improve the brightness of each solid color image while has less influence on the brightness and the color gamut of the entire display image.

The pixel structure according to the first embodiment is applicable to a liquid crystal display device, and is also applicable to a top emission type or bottom emission type organic light-emitting diode (OLED) display device.

Figure 2:
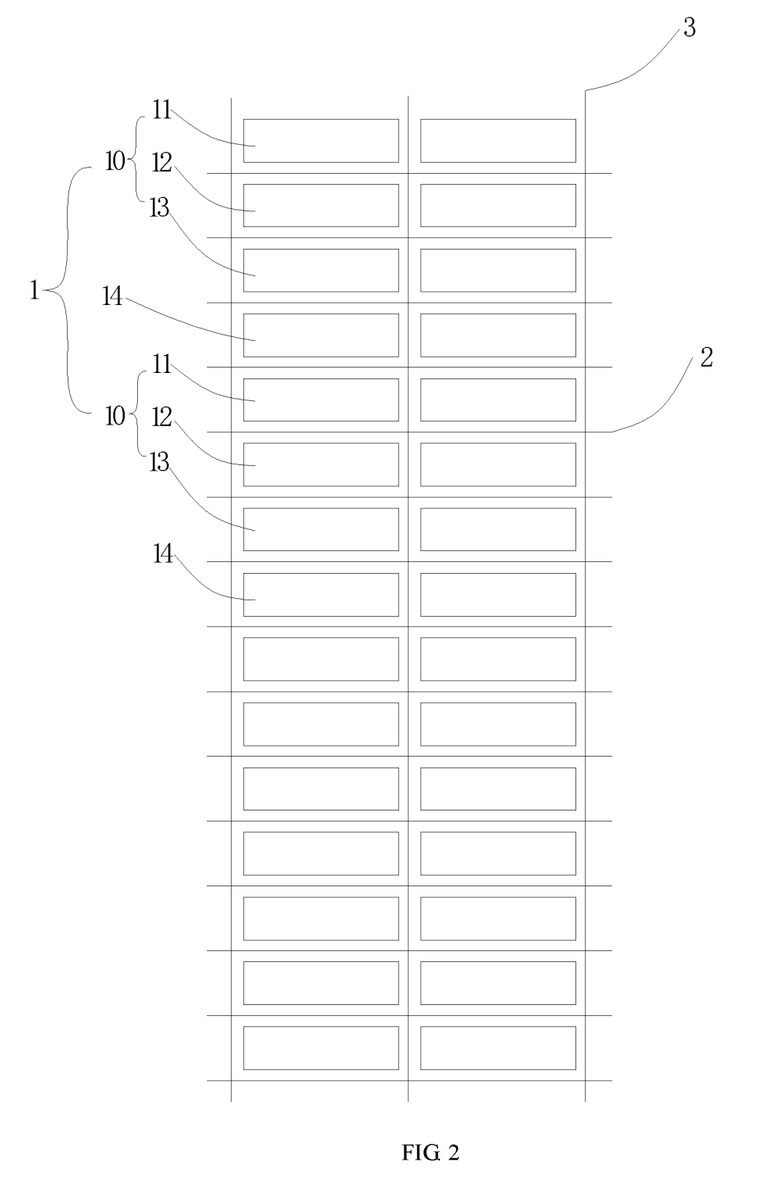
FIG. 2 is a schematic diagram of a pixel structure according to a second embodiment of the present disclosure.

FIG. 2 shows a pixel structure according to a second embodiment of the present disclosure. Different from the first embodiment, in the second embodiment, the fourth sub-pixels 14 and the three-primary-color sub-pixel groups 10 are alternately arranged in the column direction, and in the three-primary-color sub-pixel group 10, the first sub-pixel 11, the second sub-pixel 12 and the third sub-pixel 13 are also sequentially arranged in the column direction. The first sub-pixel 11, the second sub-pixel 12, the third sub-pixel 13 and the fourth sub-pixel 14 of the three-primary-color sub-pixel group 10 are all connected to a same data line 3, and each of the first sub-pixel 11, the second sub-pixel 12, the third sub-pixel 13 and the fourth sub-pixel 14 is connected to a corresponding scan line 2.

Each of the first sub-pixel 11, the second sub-pixel 12, the third sub-pixel 13 and the fourth sub-pixel 14 is located on the same side of the corresponding scan line 2, which has the advantage that even within the same display area, when it is required to reduce the distance between two adjacent scan lines 2 due to the increase of the number of scan lines 2, because the two adjacent scan lines 2 are separated by the first sub-pixel 11, the second sub-pixel 12, the third sub-pixel 13 or the fourth sub-pixel 14, the capacitive effect between the two adjacent scan lines 2, which may cause an excessive load or affect the manufacture of the scan lines 2, will not generate, thereby ensuring the display effect.

The first sub-pixel 11, the second sub-pixel 12, the third sub-pixel 13 and the fourth sub-pixel 14 are the same in area. Each of the first sub-pixel 11, the second sub-pixel 12, the third sub-pixel 13 and the fourth sub-pixel has a rectangular shape with the length extending in the row direction.

The pixel structure according to the second embodiment is applicable to a liquid crystal display device, and is also applicable to a top emission type or bottom emission type organic light-emitting diode (OLED) display device.

Figure 3:
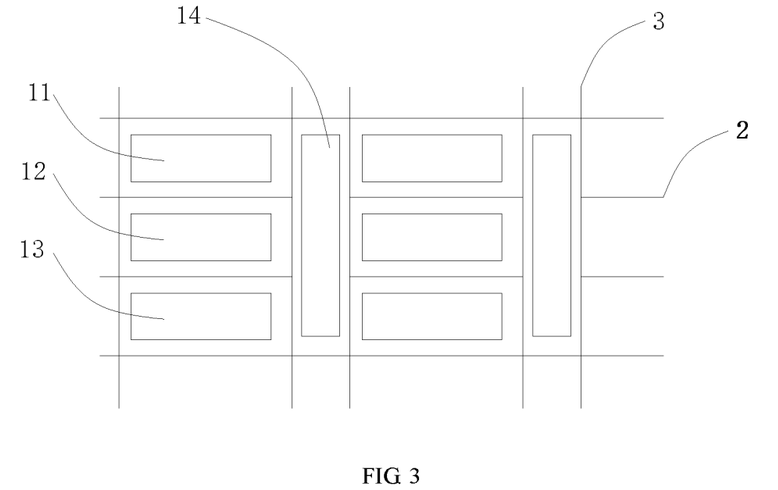
FIG. 3 is a schematic diagram of a pixel structure according to a third embodiment of the present disclosure.

FIG. 3 is a pixel structure according to a third embodiment of the present disclosure. The fourth sub-pixels 14 and the three-primary-color sub-pixel groups 10 are alternately arranged in the row direction, and the first sub-pixel 11, the second sub-pixel 12 and the third sub-pixel 13 are sequentially arranged in the column direction.

The first sub-pixel 11, the second sub-pixel 12, and the third sub-pixel 13 of the three-primary-color sub-pixel group 10 are all connected to a same data line 3, and the fourth sub-pixel 14 is connected to an adjacent one of the data lines 3, each of the first sub-pixel 11, the second sub-pixel 12 and the third sub-pixel 13 is connected to a corresponding one scanning line 2, and the fourth sub-pixel 14 may be connected to any one of the three scanning lines 2.

In the third embodiment, the number of the data lines 3 can be reduced compared with the first embodiment, and the number of the scan lines 2 can be reduced compared with the second embodiment, which is benefit to the arrangement of space between the data lines 3 and the scan lines 2 and the manufacture.

In the third embodiment, the fourth sub-pixel 14 corresponds to the first sub-pixel 11, the second sub-pixel 12 and the third sub-pixel 13 in the column direction, and the pixel structure is particularly suitable for the top emission type OLED display device. The three scan lines 2 connected in one-to-one correspondence with the first sub-pixel 11, the second sub-pixel 12 and the third sub-pixel 13 overlap with the projection of the fourth sub-pixel 14, and the light emitted by the organic light-emitting diode is directly emitted in the direction from the anode of the fourth sub-pixel 14 to the cathode without passing through the plurality of scanning lines 2 under the anode of the fourth sub-pixel 14, so that the pixel aperture ratio will not be affected (refer to FIG. 8)

Figure 4:
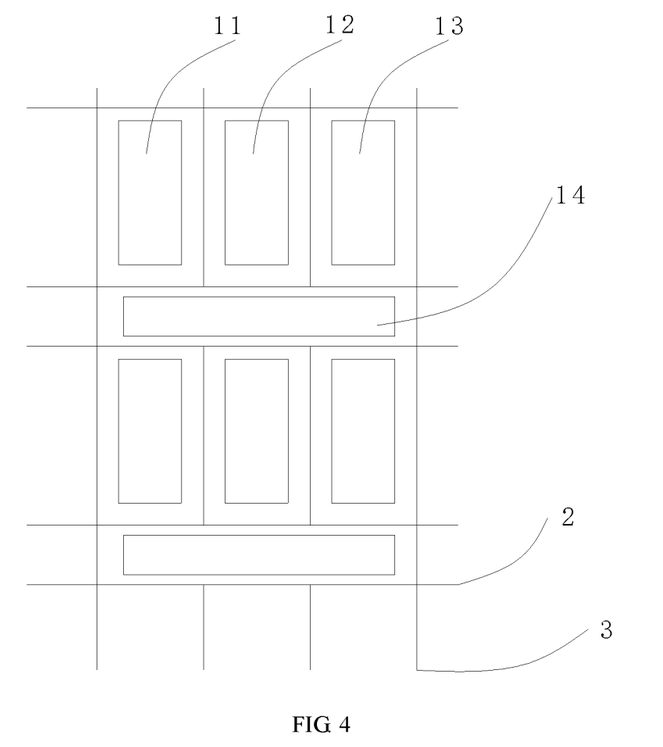
FIG. 4 is a schematic diagram of a pixel structure according to a fourth embodiment of the present disclosure.

FIG. 4 shows a pixel structure according to a fourth embodiment of the present disclosure. The fourth sub-pixels 14 and the three-primary-color sub-pixel groups 10 are alternately arranged in the column direction, and the first sub-pixel 11, the second sub-pixel 12, and the third sub-pixels 13 are sequentially arranged in the row direction. The first sub-pixel 11, the second sub-pixel 12 and the third sub-pixel 13 of the three-primary-color sub-pixel group 10 are all connected to a same scan line 2, the fourth sub-pixel 14 is connected to an adjacent scan line 2, each of the first sub-pixel 11, the second sub-pixel 12, and the third sub-pixel 13 is connected to a corresponding one data line 3, and the fourth sub-pixel 14 may be connected to any one of the three data lines 3.

In the fourth embodiment, the number of the data lines 3 can be reduced compared with the first embodiment, and the number of the scan lines 2 can be reduced compared with the second embodiment, which is benefit to the arrangement of space between the data lines 3 and the scan lines 2 and the manufacture.

The pixel structure according to the fourth embodiment is particularly suitable for the top emission type OLED display device, and details are not described herein again.

Figure 5:
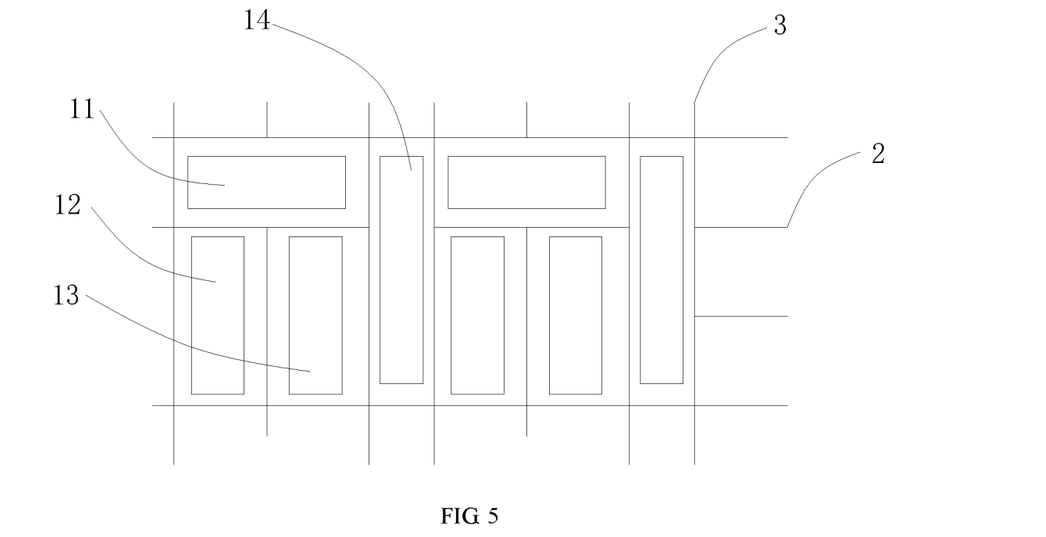
FIG. 5 is a schematic diagram of a pixel structure according to a fifth embodiment of the present disclosure.

It should be understood that the first sub-pixel 11, the second sub-pixel 12 and the third sub-pixel 13 of the three-primary-color sub-pixel group 10 may alternatively be arranged in two rows or two columns. FIG. 5 shows a pixel structure according to a fifth embodiment of the present disclosure. In the three-primary-color sub-pixel group 10, the first sub-pixel 11 is arranged in one row, and the second sub-pixel 12 and the third sub-pixel 13 are arranged in another row. The first sub-pixel 11 and the fourth sub-pixel 14 are both connected to a same scan line 2, and the second sub-pixel 12 and the third sub-pixel 13 are both connected to a same adjacent scan line 2, the first sub-pixel 11 and the second sub-pixel 12 are both connected to a same data line 3, and the third sub-pixel 13 is connected to an adjacent data line 3. The number of the data lines 3 can be further reduced compared with the first embodiment, and the number of scan lines 2 can be reduced compared with the second embodiment.

Alternatively, the third sub-pixel 13 and the adjacent fourth sub-pixel 14 may be both connected to a same data line 3 so as to further reduce the number of the data lines 3 to reduce the process cost.

The pixel structure according to the fifth embodiment is particularly suitable for the top emission type OLED display device, and details are not described herein again.

Figure 6:
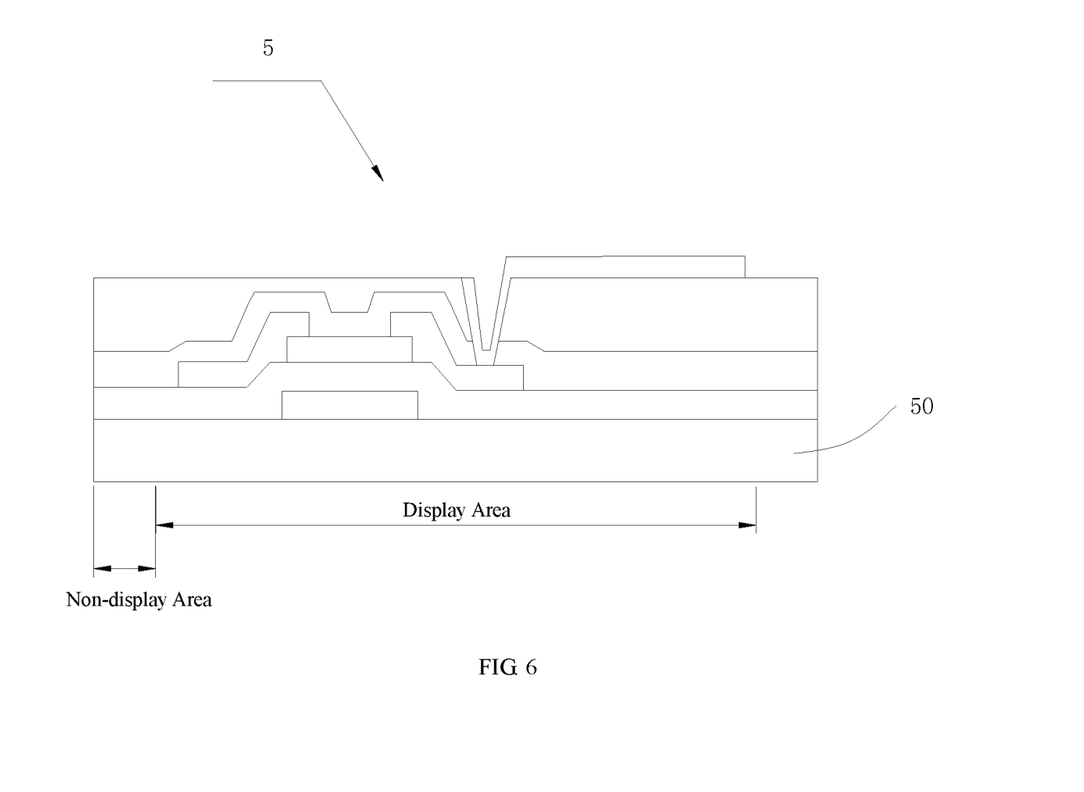
FIG. 6 is a schematic diagram of a structure of an array substrate according to a sixth embodiment of the present disclosure.

The present disclosure further provides an array substrate 5. As shown in FIG. 6, the array substrate 5 includes a base layer 50 which has a display area and a non-display area around the display area. The pixel structure according to any one of the first to fifth embodiments is arranged within the display area.

The present disclosure further provides a display device including the array substrate 5 described above.

Figure 7:
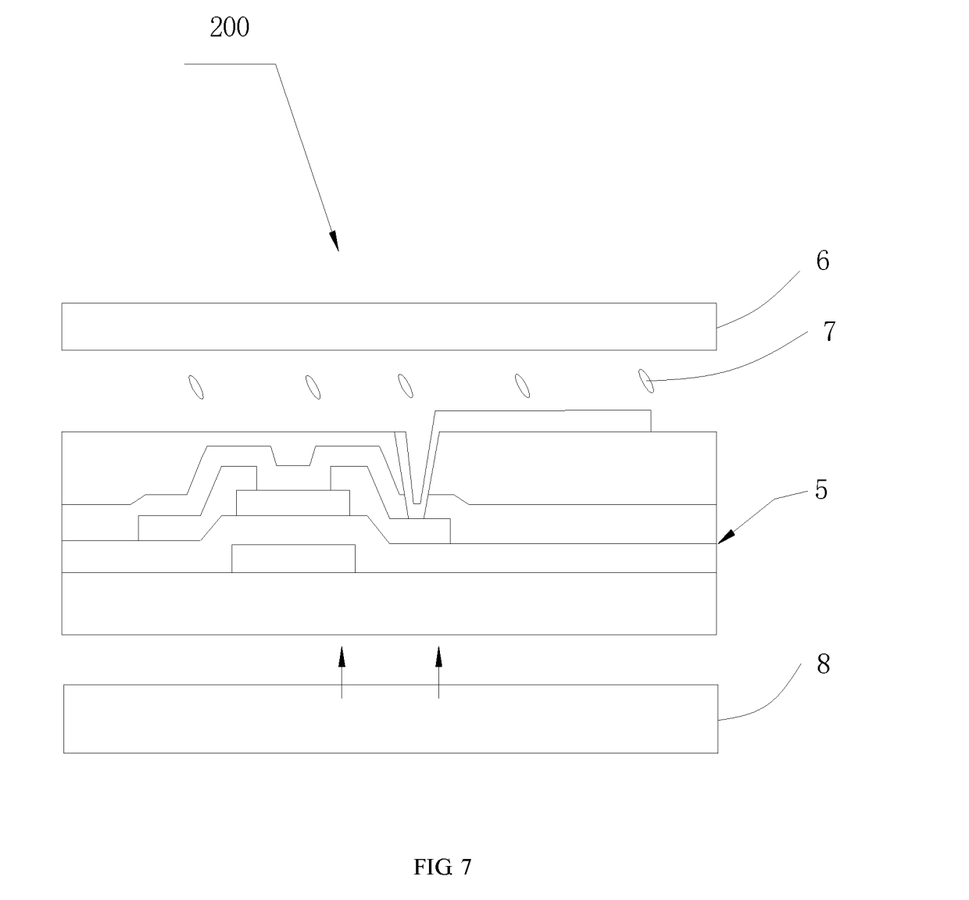
FIG. 7 is a schematic diagram of a structure of a display device according to a seventh embodiment of the present disclosure.

In an embodiment, the display device 200 is a liquid crystal display device. As shown in FIG. 7, the array substrate 5 includes the pixel structures according to the first embodiment or the second embodiment. The array substrate 5, the color film substrate 6 opposed to the array substrate 5 and the liquid crystal layer 7 between the array substrate 5 and the color film substrate 6 form a liquid crystal display panel. The backlight module 8 is arranged on the other side of the array substrate 5. The backlight module 8 and the liquid crystal display panel form the liquid crystal display device.

Figure 8:
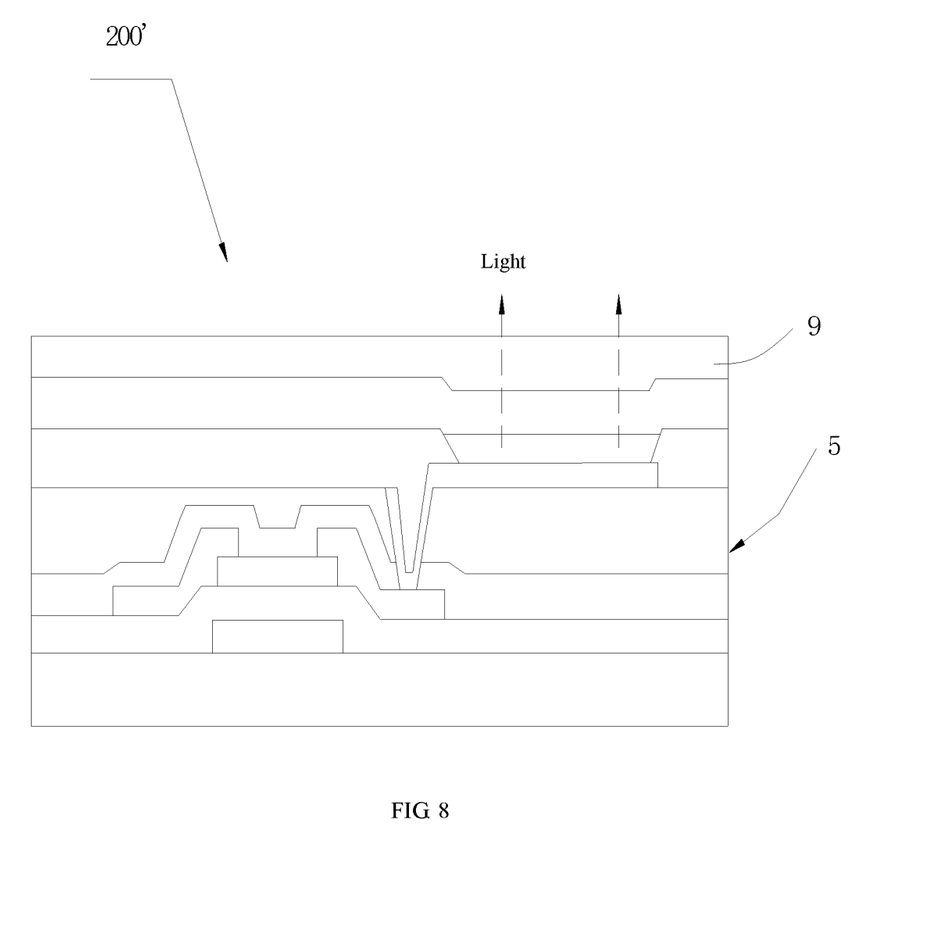
FIG. 8 is a schematic diagram of another structure of a display device according to the seventh embodiment of the present disclosure.

In an embodiment, the display device 200' is an OLED display device. As shown in FIG. 8, the array substrate 5 includes the pixel structures described in any one of the first to fifth embodiments. The array substrate 5 and the package cover plate 9 form the OLED display device.

The above shows only some optional embodiments of the present disclosure, and is not intended to limit the present disclosure. To those skilled in the art, various changes and modifications can be made. Any modifications, equivalent substitutions and improvements made within the spirit and principles of the present disclosure are included in the scope of protection of the present disclosure.

What is claimed is:

1. A pixel structure, comprising:
   a plurality of pixel units arranged in an array form;
   a plurality of scan lines; and
   a plurality of data lines;
   wherein the pixel unit includes:
   a plurality of three-primary-color sub-pixel groups, wherein the three-primary-color sub-pixel group includes a first sub-pixel, a second sub-pixel and a third sub-pixel; and
   a plurality of fourth sub-pixels, wherein one of the fourth sub-pixels is arranged between adjacent two of the three-primary-color sub-pixel groups, and the fourth sub-pixel has a color different from any of the first sub-pixel, the second sub-pixel and the third sub-pixel, each fourth sub-pixel is arranged between respective two adjacent three-primary-color sub-pixel groups, each fourth sub-pixel is shared by each the two adjoining three-primary-color sub-pixel groups, and a number of the fourth sub-pixels is one less than the number of the three-primary-color sub-pixel groups.

2. The pixel structure of claim 1, wherein the plurality of fourth sub-pixels and the plurality of three-primary-color sub-pixel groups are alternately arranged in a row direction; or
   the plurality of fourth sub-pixels and the plurality of three-primary-color sub-pixel groups are alternately arranged in a column direction.

3. The pixel structure of claim 1, wherein the fourth sub-pixel is selected from a group consisting of white sub-pixel, yellow sub-pixel and cyan sub-pixel, and the first sub-pixel, the second sub-pixel and the third sub-pixel are selected from a group consisting of red sub-pixel, green sub-pixel, and blue sub-pixel.

4. The pixel structure of claim 3, wherein the first sub-pixel, the second sub-pixel, and the third sub-pixel are the same in area.

5. The pixel structure of claim 3, wherein the areas of the first sub-pixel, the second sub-pixel, and the third sub-pixel are not completely equal.

6. The pixel structure of claim 4, wherein the first sub-pixel, the second sub-pixel, the third sub-pixel, and the fourth sub-pixel are the same in area.

7. The pixel structure of claim 1, wherein the first sub-pixel, the second sub-pixel, the third sub-pixel, and the fourth sub-pixel are arranged in a column direction and connected to a same one of the data lines, and each of the first sub-pixel, the second sub-pixel, the third sub-pixel and the fourth sub-pixel is connected to a corresponding one of the scan lines.

8. The pixel structure of claim 7, wherein the first sub-pixel, each of the second sub-pixel, the third sub-pixel and the fourth sub-pixel is located at a same side of scan lines.

9. The pixel structure of claim 1, wherein the first sub-pixel, the second sub-pixel, the third sub-pixel, and the fourth sub-pixel are arranged in a row direction and connected to a same one of the scan lines, and each of the first sub-pixel, the second sub-pixel, the third sub-pixel and the fourth sub-pixel is connected to a corresponding one of the data lines.

10. The pixel structure of claim 9, wherein each of the first sub-pixel, the second sub-pixel, the third sub-pixel and the fourth sub-pixel is located at a same side of the data lines.

11. The pixel structure of claim 1, wherein the fourth sub-pixels and the three-primary-color sub-pixel groups are alternately arranged in a row direction, and the first sub-pixel, the second sub-pixel and the third sub-pixel of one said three-primary-color sub-pixel group are sequentially arranged in a column direction.

12. The pixel structure of claim 11, wherein the first sub-pixel, the second sub-pixel and the third sub-pixel are connected to a same one of the data lines, the fourth sub-pixel is connected to an adjacent one of the data lines, each of the first sub-pixel, the second sub-pixel and the third sub-pixel is connected to a corresponding scan line, and the fourth sub-pixel is connected to any one of three said corresponding scan lines.

13. The pixel structure of claim 1, wherein the fourth sub-pixels and the three-primary-color sub-pixel groups are alternately arranged in a column direction, and the first sub-pixel, the second sub-pixel and the third sub-pixel of one said three-primary-color sub-pixel group are sequentially arranged in a row direction.

14. An array substrate, comprising a base layer which has a display area and a non-display area around the display area, wherein a pixel structure is arranged in the display area, the pixel structure comprises a plurality of pixel units arranged in an array form, a plurality of scan lines and a plurality of data lines;
wherein the pixel unit includes:
four three-primary-color sub-pixel groups, wherein the three-primary-color sub-pixel group includes a first sub-pixel, a second sub-pixel and a third sub-pixel; and
three fourth sub-pixels, wherein each of the four sub-pixels is arranged between two adjacent three-primary-color sub-pixel groups, the fourth sub-pixel has a color different from any of the first sub-pixel, the second sub-pixel and the third sub-pixel, and the first sub-pixel, the second sub-pixel, the third sub-pixel and the fourth sub-pixel are the same in area, each fourth sub-pixel is arranged between respective two adjacent three-primary-color sub-pixel groups, each fourth sub-pixel is shared by each the two adjoining three-primary-color sub-pixel groups, and a number of the fourth sub-pixels is one less than the number of the three-primary-color sub-pixel groups.

15. A display device, comprising an array substrate, wherein the array substrate comprises a base layer, the base layer has a display area and a non-display area around the display area, a pixel structure is arranged in the display area, and the pixel structure comprises a plurality of pixel units arranged in an array form, a plurality of scan lines and a plurality of data lines;
wherein the pixel unit includes:
a plurality of three-primary-color sub-pixel groups, wherein the three-primary-color sub-pixel group includes a first sub-pixel, a second sub-pixel and a third sub-pixel; and
a plurality of fourth sub-pixels, wherein one of the fourth sub-pixels is arranged between adjacent two of the plurality of three-primary-color sub-pixel groups, and the fourth sub-pixel has a color different from any of the first sub-pixel, the second sub-pixel and the third sub-pixel, each fourth sub-pixel is arranged between respective two adjacent three-primary-color sub-pixel groups, each fourth sub-pixel is shared by each the two adjoining three-primary-color sub-pixel groups, and a number of the fourth sub-pixels is one less than the number of the three-primary-color sub-pixel groups.

16. The display device of claim 15, wherein the display device is a liquid crystal display device or an organic light emitting diode display device.

17. The pixel structure of claim 1, wherein the first sub-pixel is arranged in one row, and the second sub-pixel and the third sub-pixel are arranged in another row, the first sub-pixel and the fourth sub-pixel are both connected to a same scan line, and the second sub-pixel and the fourth sub-pixel are both connected to a same adjacent scan line, the first sub-pixel and the second sub-pixel are both connected to a same data line, and the third sub-pixel is connected to an adjacent data line.

18. The pixel structure of claim 1, wherein a share of the fourth sub-pixels is achieved by a comparator, each of two input terminals of the comparator is connected to a corresponding one of two data signals from a source driver, an output terminal of the comparator is connected to a data line connected to the fourth sub-pixel, and the output terminal of the comparator outputs the larger of the two input data signals.

19. The pixel structure of claim 1, wherein in each pixel unit, a number of the fourth sub-pixels is three, and a number of a first sub-pixel is four, a number of a second sub-pixel is four, a number of a third sub-pixel is four.

20. The pixel structure of claim 1, wherein in each pixel unit, a number of the fourth sub-pixels is one, and a number of a first sub-pixel is two, a number of a second sub-pixel is two, a number of a third sub-pixel is two.

* * * * *